(12) United States Patent
Teo et al.

(10) Patent No.: US 10,886,393 B2
(45) Date of Patent: Jan. 5, 2021

(54) HIGH ELECTRON MOBILITY TRANSISTOR WITH TUNABLE THRESHOLD VOLTAGE

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 65 days.

(21) Appl. No.: 15/785,596

(22) Filed: Oct. 17, 2017

(65) Prior Publication Data

US 2019/0115463 A1 Apr. 18, 2019

(51) Int. Cl.
*H01L 29/778* (2006.01)
*H01L 29/78* (2006.01)
(Continued)

(52) U.S. Cl.
CPC ...... *H01L 29/7787* (2013.01); *H01L 21/0254* (2013.01); *H01L 21/28593* (2013.01); *H01L 21/30612* (2013.01); *H01L 21/30621* (2013.01); *H01L 29/1037* (2013.01); *H01L 29/2003* (2013.01); *H01L 29/205* (2013.01); *H01L 29/423* (2013.01); *H01L 29/42316* (2013.01); *H01L 29/42356* (2013.01);
(Continued)

(58) Field of Classification Search
CPC .......... H01L 29/1029; H01L 29/42316; H01L 29/66462; H01L 29/7787; H01L 29/2003
See application file for complete search history.

(56) References Cited

U.S. PATENT DOCUMENTS 6,475,869 B1* 11/2002 Yu .................. H01L 29/165
257/E29.085
6,605,521 B2 8/2003 Ajmera et al.
(Continued)

FOREIGN PATENT DOCUMENTS

CN 107123673 A * 9/2017
JP 2016054215 A 4/2016
(Continued)

OTHER PUBLICATIONS

Machine translated document (Year: 2017).*
(Continued)

*Primary Examiner* — Ahmed N Sefer
(74) *Attorney, Agent, or Firm* — Gennadiy Vinokur; James McAleenan; Hironori Tsukamoto

(57) ABSTRACT

A high electron mobility transistor includes a set of electrodes, such as a source, a drain, a top gate, and a side gate, and includes a semiconductor structure having a fin extending between the source and the drain. The top gate is arranged on top of the fin, and the side gate is arranged on a sidewall of the fin at a distance from the top gate. The semiconductor structure includes a cap layer positioned beneath the top gate and a channel layer arranged beneath the cap layer for providing electrical conduction. The cap layer includes nitride-based semiconductor material to enable a heterojunction forming a carrier channel between the source and the drain.

14 Claims, 13 Drawing Sheets

(51) Int. Cl.
*H01L 29/423* (2006.01)
*H01L 29/20* (2006.01)
*H01L 29/10* (2006.01)
*H01L 29/51* (2006.01)
*H03K 17/687* (2006.01)
*H01L 29/66* (2006.01)
*H01L 21/306* (2006.01)
*H01L 21/285* (2006.01)
*H01L 21/02* (2006.01)
*H01L 29/205* (2006.01)
*H01L 29/06* (2006.01)

(52) U.S. Cl.
CPC ...... *H01L 29/42376* (2013.01); *H01L 29/516* (2013.01); *H01L 29/6684* (2013.01); *H01L 29/66462* (2013.01); *H01L 29/66484* (2013.01); *H01L 29/66795* (2013.01); *H01L 29/7783* (2013.01); *H01L 29/7786* (2013.01); *H01L 29/7831* (2013.01); *H01L 29/7851* (2013.01); *H01L 29/78391* (2014.09); *H03K 17/687* (2013.01); *H01L 21/0262* (2013.01); *H01L 21/02631* (2013.01); *H01L 29/0657* (2013.01)

(56) References Cited

U.S. PATENT DOCUMENTS

| | | | |
|---|---|---|---|
| 7,888,743 B2 | 2/2011 | Anderson et al. | |
| 8,120,073 B2 | 2/2012 | Rakshit et al. | |
| 10,090,204 B1* | 10/2018 | Zang | H01L 21/823462 |
| 2002/0036290 A1* | 3/2002 | Inaba | H01L 29/42384 257/66 |
| 2007/0111419 A1* | 5/2007 | Doyle | H01L 21/82380 438/197 |
| 2007/0187715 A1* | 8/2007 | Zhao | H01L 29/1066 257/135 |
| 2008/0087942 A1* | 4/2008 | Hsu | H01L 27/115 257/324 |
| 2011/0063019 A1* | 3/2011 | Chang | H01L 21/84 327/537 |
| 2012/0112251 A1 | 5/2012 | Forbes et al. | |
| 2012/0175712 A1* | 7/2012 | Chang | H01L 29/66795 257/392 |
| 2012/0292665 A1* | 11/2012 | Marino | H01L 29/1029 257/194 |
| 2013/0264630 A1 | 10/2013 | Kim et al. | |
| 2014/0151756 A1* | 6/2014 | Chang | H01L 29/42392 257/288 |
| 2015/0357350 A1 | 12/2015 | Zhu et al. | |
| 2015/0372081 A1* | 12/2015 | Lee | H01L 29/66469 257/76 |
| 2016/0308070 A1* | 10/2016 | Chang | H01L 29/792 |
| 2017/0162702 A1 | 6/2017 | Hu et al. | |
| 2017/0345895 A1* | 11/2017 | Sarkozy | H01L 29/0665 |

FOREIGN PATENT DOCUMENTS

| | | |
|---|---|---|
| JP | 6027531 B2 | 10/2016 |
| TW | 1550695 B | 9/2016 |
| WO | 2011101463 A1 | 8/2011 |

OTHER PUBLICATIONS

Chowdhurry et al. "A Physical Based Analytical modeling of Threshold Voltage Control for Fully Depleted SOI Double Gate NMOS-PMOS Flexible FET," Electro/Information Technology (EIT), 2012 IEEE International Conference on, May 5-8, 2012, Indianapolis, IN, USA.

* cited by examiner

HIGH ELECTRON MOBILITY TRANSISTOR WITH TUNABLE THRESHOLD VOLTAGE

TECHNICAL FIELD

The present invention relates generally to semiconductor device such as high electron mobility transistors.

BACKGROUND

With the recent upsurge of the wireless communication market, as well as the steady but continuous progress of power applications, microwave transistors are playing critical roles in many aspects of human activities. The requirements for the performance of microwave transistors are becoming more and more demanding. In the personal mobile communication applications, next generation cell phones require wider bandwidth and improved efficiency. The development of satellite communications and TV broadcasting requires amplifiers operating at higher frequencies (from C band to Ku band, further to Ka band) and higher power to reduce the antenna size of terminal users. The same requirement holds for broadband wireless internet connections as well because of the ever increasing speed or data transmission rate.

Because of these needs, there has been significant investment in the development of high performance microwave transistors and amplifiers based on Si/SiGe, GaAs, SiC and GaN. The Johnson Figure of Merit (JM) gives the power-frequency limit based solely on material properties and can be used to compare different materials for high frequency and high power applications. The requirement for high power and high frequency requires transistors based on semiconductor materials with both large breakdown voltage and high electron velocity. From this point of view, wide bandgap materials, like GaN and SiC, with higher JM are preferable. The wide bandgap results in higher breakdown voltages because the ultimate breakdown field is the field required for band-to-band impact ionization, which allow high frequency operation.

The ability of GaN to form heterojunctions makes it superior compared to SiC, in spite of having similar breakdown fields and saturation electron velocities. GaN can be used to fabricate high electron mobility transistors (HEMTs) whereas SiC can only be used to fabricate metal semiconductor field effect transistors (MESFETs). The advantages of the HEMT include its high carrier concentration and its higher electron mobility due to reduced ionized impurity scattering. The combination of high carrier concentration and high electron mobility results in a high current density and a low channel resistance, which are especially important for high frequency operation and power switching applications.

From the amplifier point of view, GaN-based HEMTs have many advantages over existing production technologies. The high output power density allows the fabrication of much smaller size devices with the same output power. Higher impedance due to the smaller size allows for easier and lower loss matching in amplifiers. The operation at high voltage due to its high breakdown electric field not only reduces the need for voltage conversion, but also provides the potential to obtain high efficiency, which is a critical parameter for amplifiers. The wide bandgap also enables the GaN-based HEMTs to operate at high temperatures. At the same time, the HEMT offers better noise performance than that of MESFET's.

These attractive features in amplifier applications enabled by the superior semiconductor properties make the GaN-based HEMT a very promising candidate for microwave power applications.

In a depletion mode high electron mobility transistor (HEMT), an electric field generated from the gate electrode is used to deplete a two dimensional electron gas channel at the interface of wide and narrow energy bandgap semiconductor, such as AlN/GaN or AlGaN/GaN. A control voltage can be applied to the gate electrode to directly affect and control the amount of current flowing through the channel. The depletion mode transistors function as "normally-on" devices when used as switches. For an enhancement mode transistor, no channel is present and no current flow occurs until the transistor is biased for operation. In particular, the transistor is biased and a voltage is applied to the gate in order to move the two dimensional electron gas channel below the Fermi level. Once another voltage is applied between the source and drain, the electrons in the two dimensional electron gas channel move from source to drain. The enhancement mode transistors are commonly used for digital and analog integrated circuits (ICs) and can function as "normally-off" devices.

Enhancement mode (E-mode) HEMTs are useful for analog circuit applications, such as RF/microwave power amplifiers or switches.

Direct-coupled FET logic (DCFL) by integration of E-mode and depletion-mode (D-mode) HEMTs, referred to as E/D DCFL, is currently being researched for high speed and high-density digital circuit applications.

Wide band gap AlGaN/GaN HEMTs have emerged as devices of interest for RF/microwave power amplifiers because of their high power and high speed handling capabilities. As the push to scale down and increase performance continues for high power, high frequency applications. In particular, the large band-gap of AlN (6.2 eV) provides improved carrier confinement and lowers gate leakage current as compared to conventional AlGaN barriers and results in improvement of both low and high field carrier transport. Both a high carrier density and high carrier mobility are desirable to achieve high output current.

To reduce alloy scattering and improve channel conductivity, structures with very thin AlN barrier layers are an attractive option for high speed, high voltage, high power devices, if the sheet density under the gate region of the HEMT can be made low enough for E-mode operation.

Current research in AlGaN/GaN HEMTs shows promise for high power, high temperature applications. In addition, for applications using transistors as switches or high temperature capable integrated circuits, it is also desirable to have normally off or enhancement mode operation devices. Accordingly, there continues to be a need in the art for improved methods and structures for devices capable of performing in high power, high voltage, high speed, and/or high temperature applications.

SUMMARY

Some embodiments are based on recognition that there are a number of factors influencing the value of the threshold voltage of a transistor that can be difficult to predict and control in advance. For example, the threshold voltage can be effected by specifics of manufacturing of the transistor that varies among individual transistors. Also, the threshold voltage can be effected by specifics of operation of the transistor that also varies among individual transistors. To that end, some embodiments are based on recognition that it can be beneficial to change, e.g., tune, the threshold voltage of the transistor during its operation.

Additionally, or alternatively, the density of the carrier channel depends on the voltage applied to the channel with respect to the source terminal of the transistor. Sometimes, the increase of the voltage applied to the source necessitate a need to change the threshold voltage, e.g., to move the threshold voltage towards a positive domain with respect to the source.

Some embodiments are based on understanding that the value of the threshold voltage can be modulated by depleting the carrier channel of the transistor-as the threshold voltage of a transistor is a function of carrier density in the channel. For example, in one embodiment, the transistor is a high electron mobility transistor (HEMT) having a heterostructure to form the carrier channel between the source and the drain. A high carrier density yields a negative voltage whereas a low carrier density yields a positive threshold voltage.

Some embodiments are based on another realization that the carrier channel can be depleted by applying voltage in direction perpendicular to the direction of drain-source voltage.

Some embodiments are based on realization that in addition to a gate of transistor, referred herein as a top gate, and used for modulating the conductivity of a carrier channel between the source and the drain, another gate, referred herein as a side gate, can be arranged to deplete the channel and to modulate the threshold voltage. Some embodiments are based on understanding that to perform such a modulation, the side gate needs to arranged at a distance from the top gate so that two different voltages can be applied independently to the different gates, at a sidewall of the transistor so that they can be sufficiently close to the carrier channel.

To that end, one embodiment discloses a transistor including a source, a drain, a top gate, a side gate, and a semiconductor structure having a fin extending between the source and the drain. The top gate is arranged on top of the fin, and a voltage applied to the top gate with respect to the source modulates the conductivity of a carrier channel between the source and the drain. The side gate is arranged on a sidewall of the fin at a distance from the top gate and a voltage applied to the side gate with respect to the source modulates a threshold voltage of the transistor, thereby making the threshold voltage of the transistor tunable.

In some implementations, the transistor includes two side gates arranged on the opposite sidewalls of the fin. Two side gates allows better control over the carriers of the channel.

The fin of the semiconductor structure allows to arrange the side gate sufficiently close to the carrier channel. For example, in one embodiment, the width of the fin is less than 400 nm. Such a width allows to achieve a maximum capacitance need for depleting the carrier channel. However, some embodiments increase the width of the fin using principle of negative capacitance. For example, in one implementation, the transistor includes a ferroelectric oxide (FE) layer arranged between the side gate and the sidewall of the fin. The FE layer form a negative capacitor allowing the width of the fin being greater than 400 nm.

Additionally, or alternatively, in some implementations, a dielectric layer arranged between the side gate and the sidewall of the fin. The dielectric layer reduces the gate current hence the power loss.

In some embodiments, the side gate is made of semiconductor material. The semiconductor material of the side gate allows easier fabrication process and yields higher performance if selected properly. For example, in one embodiment, the semiconductor material of the side gate is p-doped semiconductor making the threshold voltage even more positive by injecting the hole into the channel.

In some embodiments, the side gate has an L-shape, wherein a first leg of the L-shape is arranged on the sidewall of the fin, and wherein a second leg of the L-shape is substantially perpendicular to the first leg. This embodiment simplifies the growing the side gate on the finned semiconductor structure.

Additionally, or alternatively, the L-shape simplifies applying the voltage to the side gate to modulate the threshold voltage of the transistor. For example, in some situations, the voltage applied to the side gate is negative to move the threshold voltage towards a positive domain with respect to the source. For example, the voltage applied to the side gate is positive to move the threshold voltage towards a negative domain with respect to the source. For power electronics and digital applications, it is desirable to have normally off operation, which can be achieved by applying negative voltage to the side gate/gates. However, if we don't care about the threshold voltage-which is the case for a RF device, we can apply positive voltage to the gate increase the carrier density in the channel and thus have more current.

Some embodiments acknowledge that simulation results show increase in the linearity of the transconductance of the transistor employing principles of some embodiments. To that end, some embodiments select an absolute value of the negative voltage applied to the side gate to be proportional to a linearity of the transistor. Linearity degradation in any RF device is caused by a number of factors, one of such factor is source choking effect. This effect takes place when the source has lower current carrying ability than the channel region. The proposed transistor eliminates this effect by depleting the channel which is turn reduces the current carrying capability of the channel.

Accordingly, one embodiment discloses a high electron mobility transistor (HEMT). The HEMT includes a set of electrodes including a source, a drain, a top gate, and a side gate; and a semiconductor structure having a fin extending between the source and the drain, wherein the top gate is arranged on top of the fin, wherein the side gate is arranged on a sidewall of the fin at a distance from the top gate, wherein the semiconductor structure includes a cap layer positioned beneath the top gate and a channel layer arranged beneath the cap layer for providing electrical conduction, wherein the cap layer includes nitride-based semiconductor material to enable a heterostructure forming a carrier channel between the source and the drain.

Another embodiment discloses a method for controlling a transistor including a semiconductor structure having a fin extending between a source and a drain of the transistor, wherein a top gate of the transistor is arranged on top of the fin and a side gate of the transistor is arranged on a sidewall of the fin at a distance from the top gate. The method includes applying a voltage to the top gate with respect to the source to modulate the conductivity of a carrier channel between the source and the drain; and applying a voltage to the side gate with respect to the source to modulate a threshold voltage of the transistor.

Yet another embodiment discloses a method for manufacturing a transistor. The method includes providing a substrate and a semiconductor structure including a cap layer and a channel layer having at least one carrier channel; etching the semiconductor structure to define an active region of the transistor; forming a source and a drain electrode by metal deposition and annealing; forming a fin in the semiconductor structure by a combination of dry etching and wet etching; depositing a side gate; and depositing a top metal gate.

DETAILED DESCRIPTION

Figure 1:
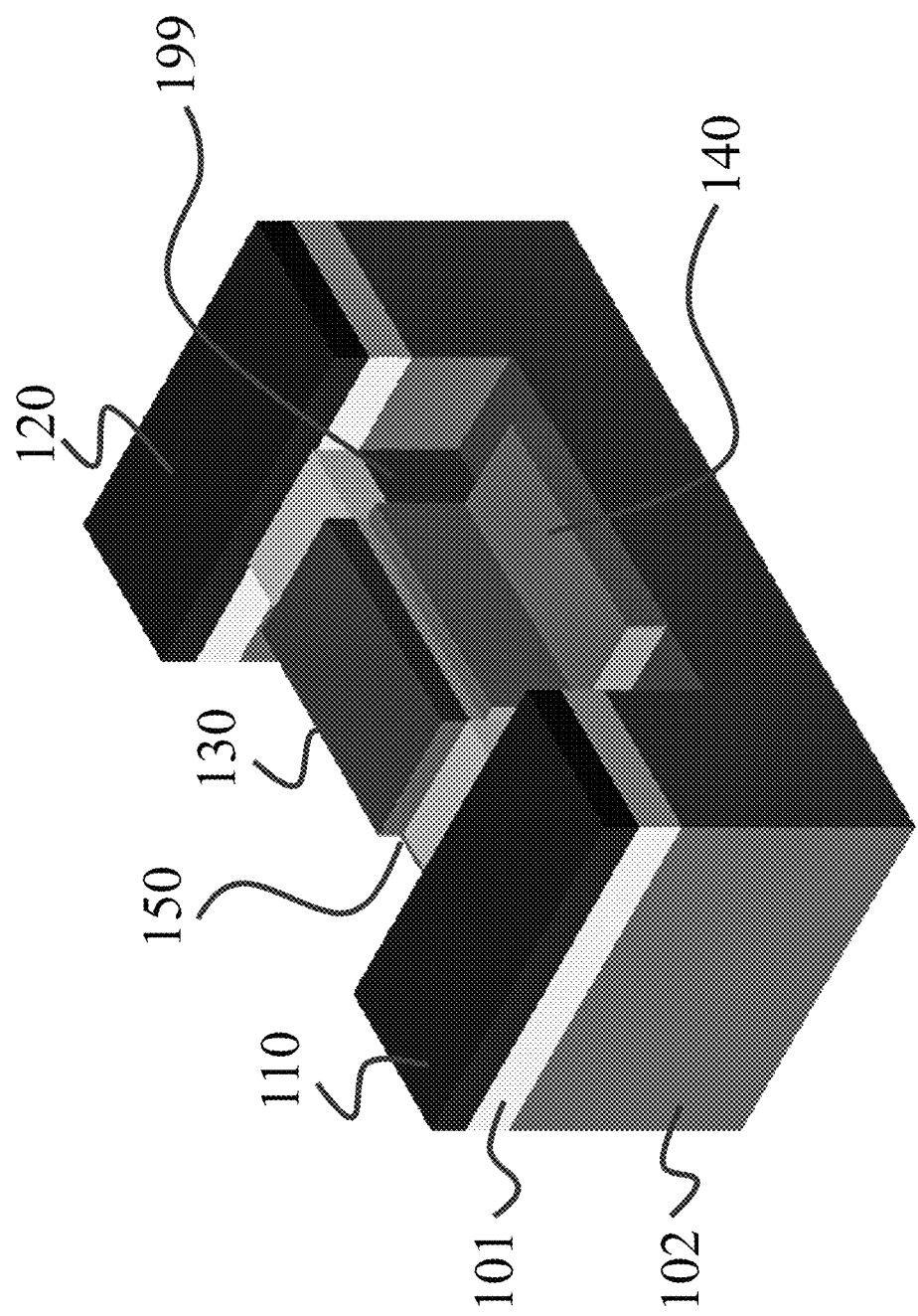
FIG. 1 shows the 3-D schematic of a high electron mobility transistor (HEMT) according to some embodiments.

FIG. 1 shows the 3-D schematic of a high electron mobility transistor (HEMT) according to some embodiments. The transistor includes a semiconductor structure having a compound semiconductor heterostructure formed between a cap layer 101 and a channel layer 102 such that a two dimensional electron gas (2-DEG) 103 is formed at the interface of cap layer and channel layer. A source electrode 110 and a drain electrode 120 are put to make electrical connection with the said 2-DEG. The semiconductor structure has a fin 199 extending between the source and the drain to facilitate the placement of side wall gates labeled 140 and/or 150 on one or the two opposite sides of the fin in order to modulate the carrier density in the channel thus the threshold voltage. A top gate labeled 130 is placed on top of the cap layer to control the conductivity of the channel. On embodiments controls the threshold voltage by having only one side wall gate, however, alternative embodiments include two side gates to provide better controllability.

Figure 2:
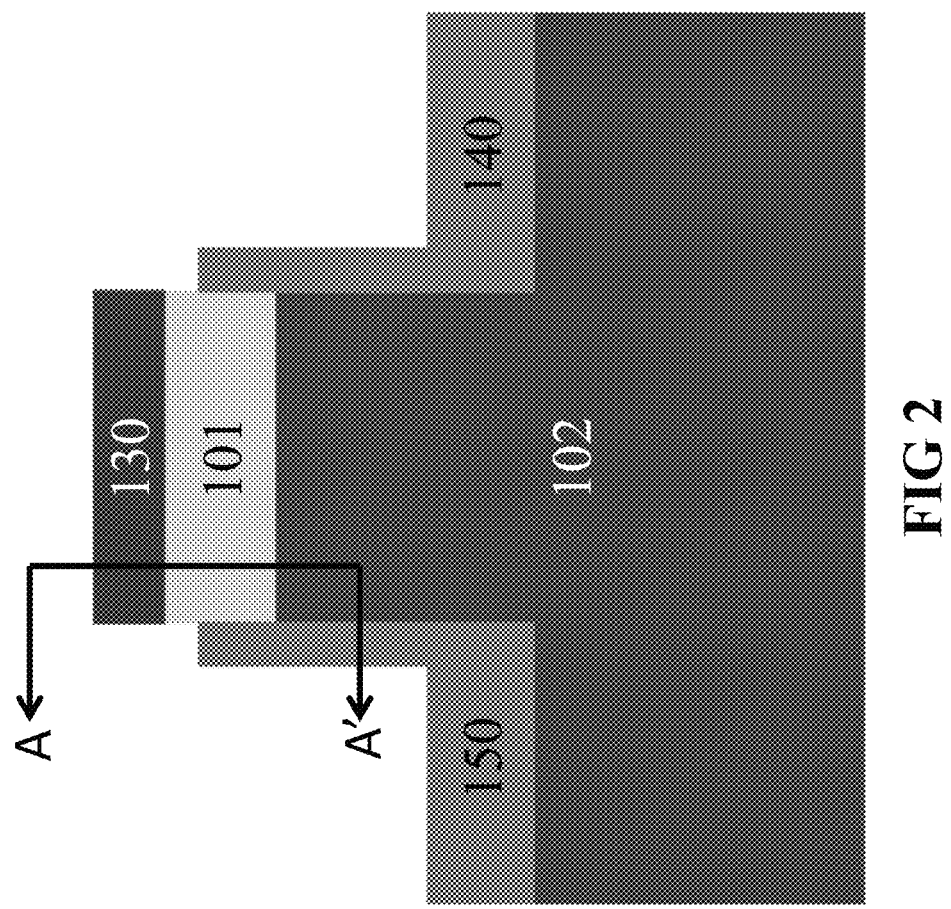
FIG. 2 shows the cross section in the middle of the channel of the transistor according to one embodiment.

FIG. 2 shows the cross section in the middle of the channel of the transistor according to one embodiment. In this embodiment, the side wall gates are L-shaped wherein the vertical leg of L-shaped side are placed in proximity to the fin side wall and the horizontal leg is just to facilitate the application of voltage to that gate.

Figure 3:
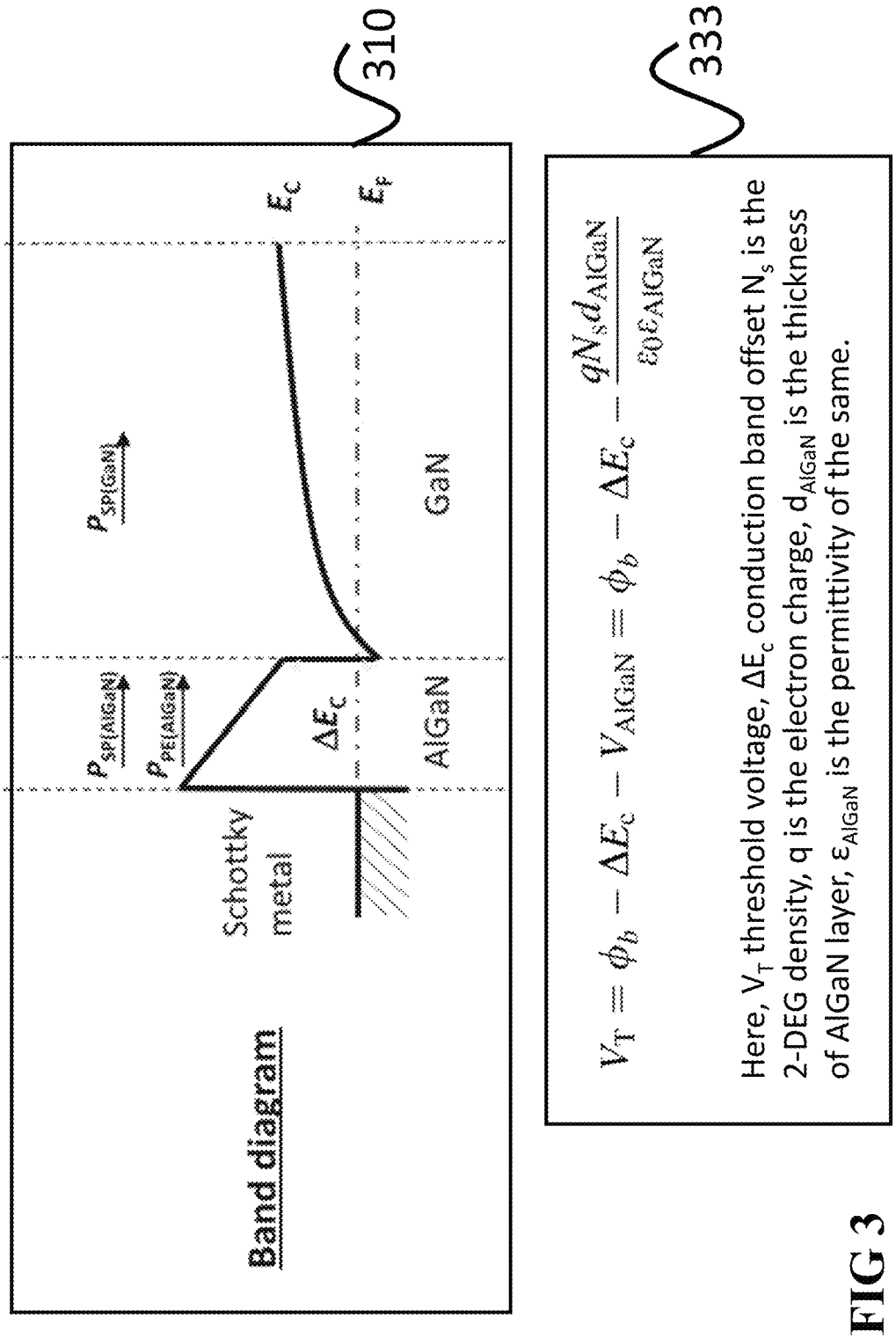
FIG. 3 shows the energy band diagram 310 along the cross-section AA' of the transistor of FIG. 2.

FIG. 3 shows the energy band diagram 310 along the cross-section AA' of the transistor of FIG. 2. From this energy band diagram, some embodiments derive the equation for threshold voltage of a HEMT labeled 333. One thing to be noted from this equation is that threshold voltage has a linear relationship with the 2-DEG concentration. Therefore, it can be inferred that one can modulate the threshold voltage of a HEMT by modulating the 2-DEG density. Generally, because of high 2-DEG density the threshold voltage of a HEMT is negative making it a normally ON device. However, by depleting the 2-DEG it is possible to make the threshold voltage positive thereby making the device normally off. To modulate the 2-DEG density side wall gates are placed.

Figure 4A:
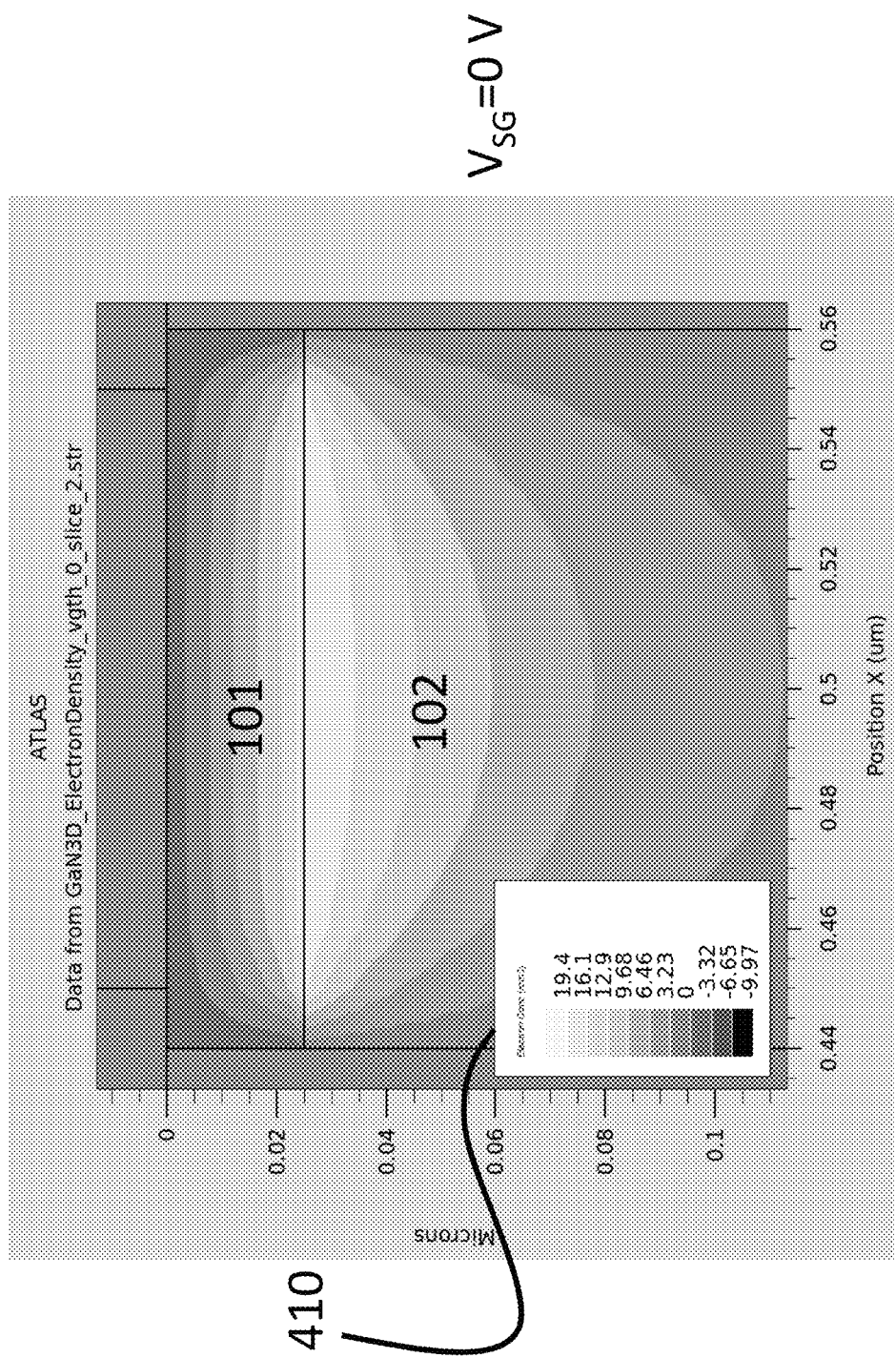
FIG. 4A and FIG. 4B show the electron density cross section profile of transistors of o different embodiments.

FIG. 4A shows the electron density cross section profile for side gate voltage of 0 V used by some embodiments. Here the scale 410 is in log(Electron-Concentration). We can observe that the electron concentration is very high at the interface of 101 and 102 layer, and it decreases monotonically as me move away from the interface in both directions.

Figure 4B:
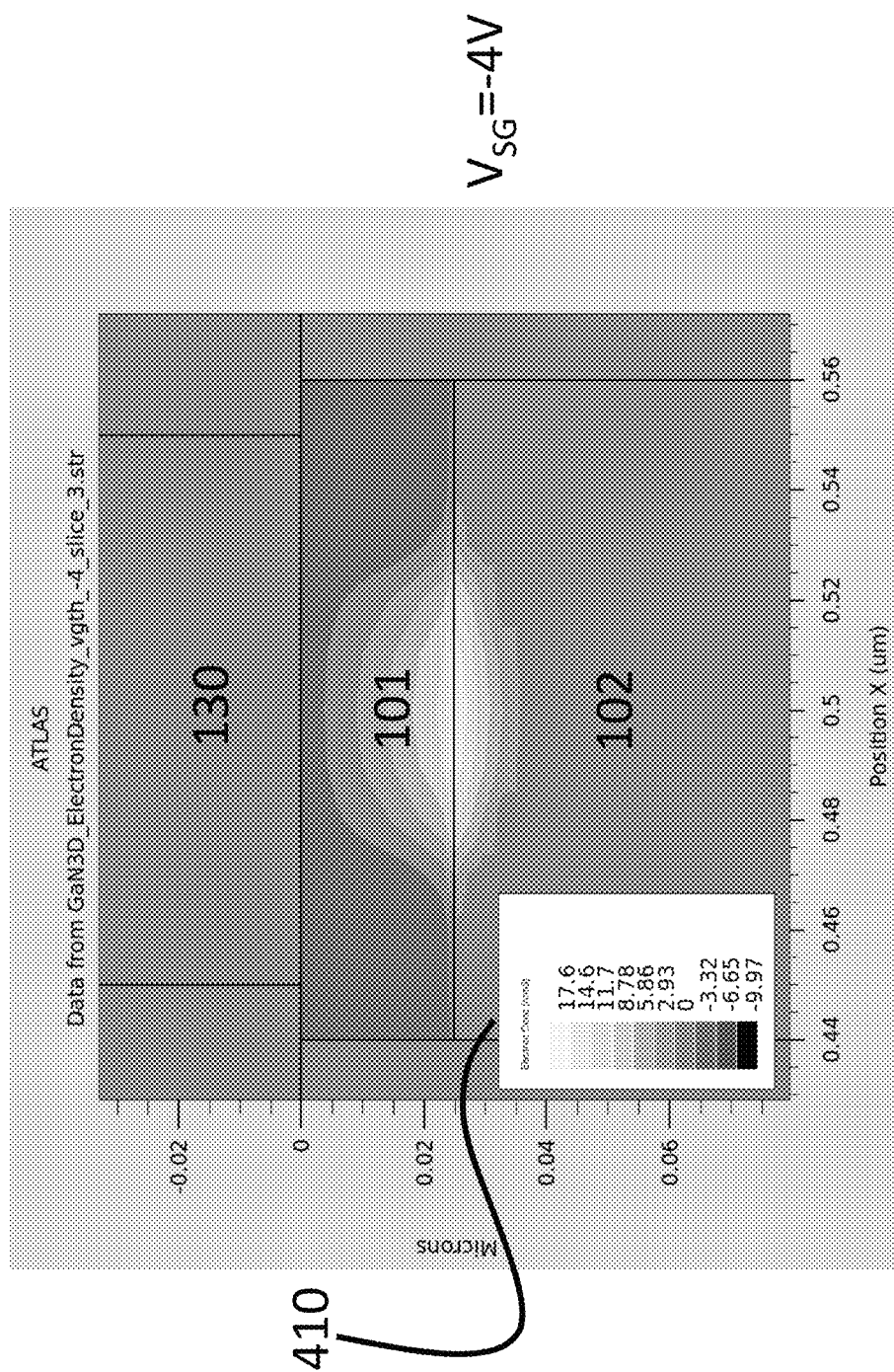

FIG. 4B shows the electron density cross section profile for side gate voltage of −4 V. Compared to FIG. 4B the electron density has been reduced significantly at least by 3 orders of magnitude. This is because as we apply negative bias to the side gate we move the fermi level in the channel higher and electron density has an exponential dependence on the fermi level ($\exp(-\text{Fermi-Energy}/(k_B T))$). Since the threshold voltage depends on the electron density, through the modulation of the electron density by the side gate we can modulate the threshold voltage.

Figure 5:
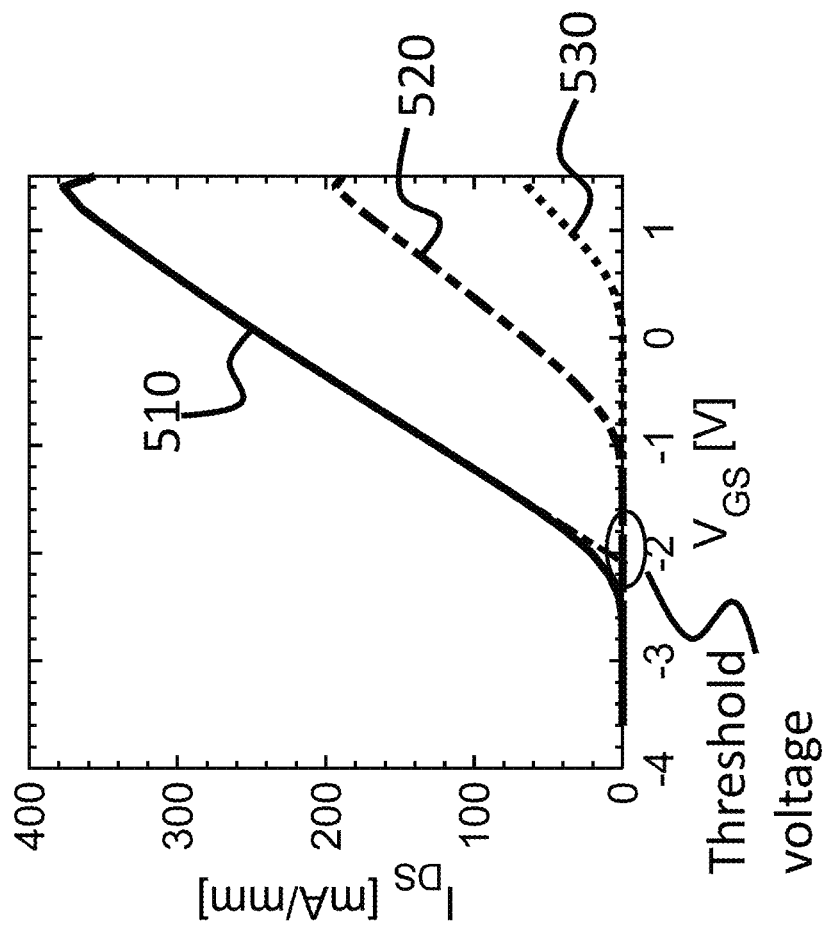
FIG. 5 shows the simulated $I_{DS}$-$V_{GS}$ characteristics for different side gate voltages.

FIG. 5 shows the simulated $I_{DS}$-$V_{GS}$ characteristics for different side gate voltages. The threshold voltage of a transistor can be measured from a $I_{DS}$-$V_{GS}$ characteristics. The gate voltage at which the drain current starts to increase rapidly is called the threshold voltage, which can be found by extrapolating the linear region of $I_{DS}$ curve and finding the point at which it crosses the gate voltage axis. As demonstrated here, the threshold voltage of the transistor is increasing as we apply more and more negative bias to the side gate. This is because applying negative bias at the side gate depletes the channel Here, 510 is the $I_{DS}$-$V_{GS}$ curve for the side gate voltage, $V_{SG}$=0 V, 520 is for $V_{SG}$=−2 V and 530 is for $V_{SG}$=−4 V.

Figure 6:
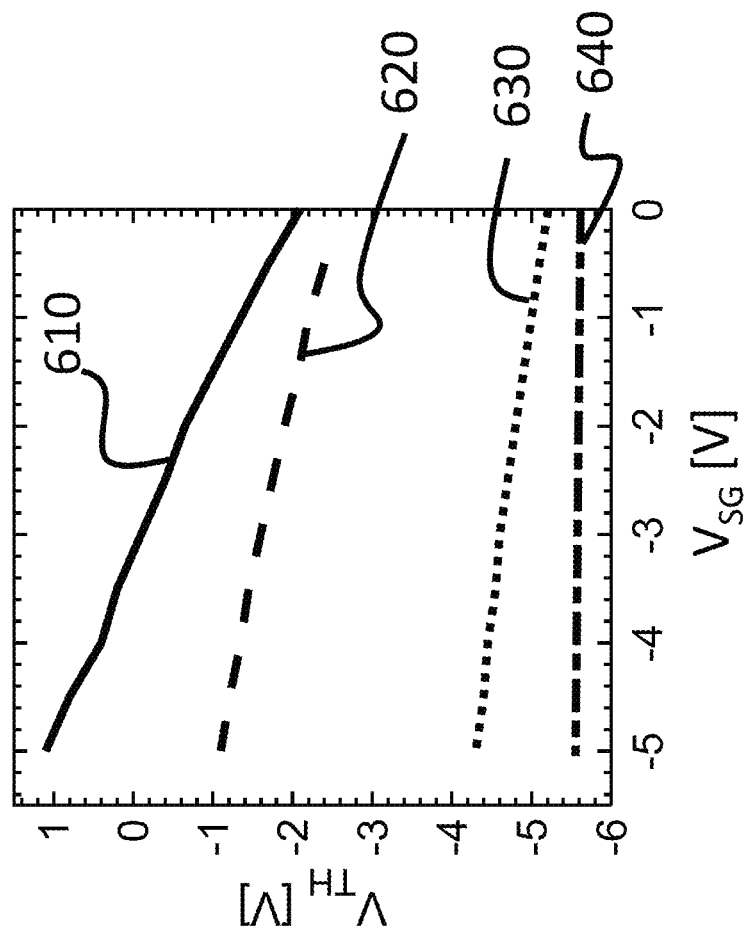
FIG. 6 shows the variation of the threshold voltage with the side gate voltage for different fin thickness used by some embodiments.

FIG. 6 shows the variation of the threshold voltage with the side gate voltage for different fin thickness used by some embodiments. Here the simulated curves are presented for fin widths 100 nm, 200 nm, 300 nm and 400 nm labeled 610, 620, 630 and 640 respectively. If we can define a controllability parameter α, defined as α=$\Delta V_{TH}/\Delta V_{SG}$ which is given by the slope of the curves. Ideally we want the magnitude of α to be as high as possible, however due to physical reasons it cannot be made more than 1. As shown in this figure the value of α decreases as we increase the fin thickness this is because as the fin thickness is increased the side wall loses the controllability of the channel due to reduced capacitance. If the fin thickness is more than 400 nm the controllability parameter α is very close to zero-which gives us the upper limit of fin thickness.

Figure 7:
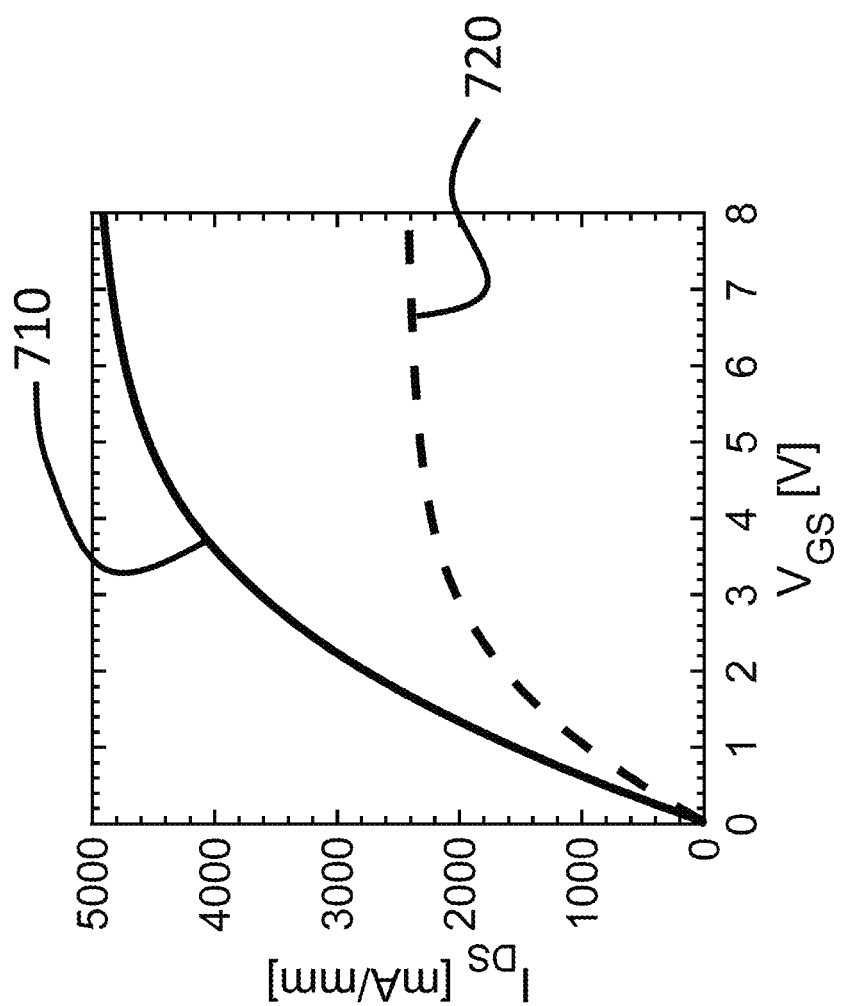
FIG. 7 shows the $I_{DS}$-$V_{DS}$ characteristics for different side gate voltage ($V_{SG}$) for 100 nm fin width transistor according to one embodiment.

FIG. 7 shows the $I_{DS}$-$V_{DS}$ characteristics for different side gate voltage ($V_{SG}$) for 100 nm fin width transistor according to one embodiment. The curve 710 shows an example wherein $V_{SG}$=0V and the curve 720 shows an example when $V_{SG}$=−3V. When a negative tuner voltage is applied, drain current drops sharply due to the increment of in the threshold voltage, which in turn reduces the overdrive voltage ($V_{DS}$-$V_{TH}$).

Figure 8:
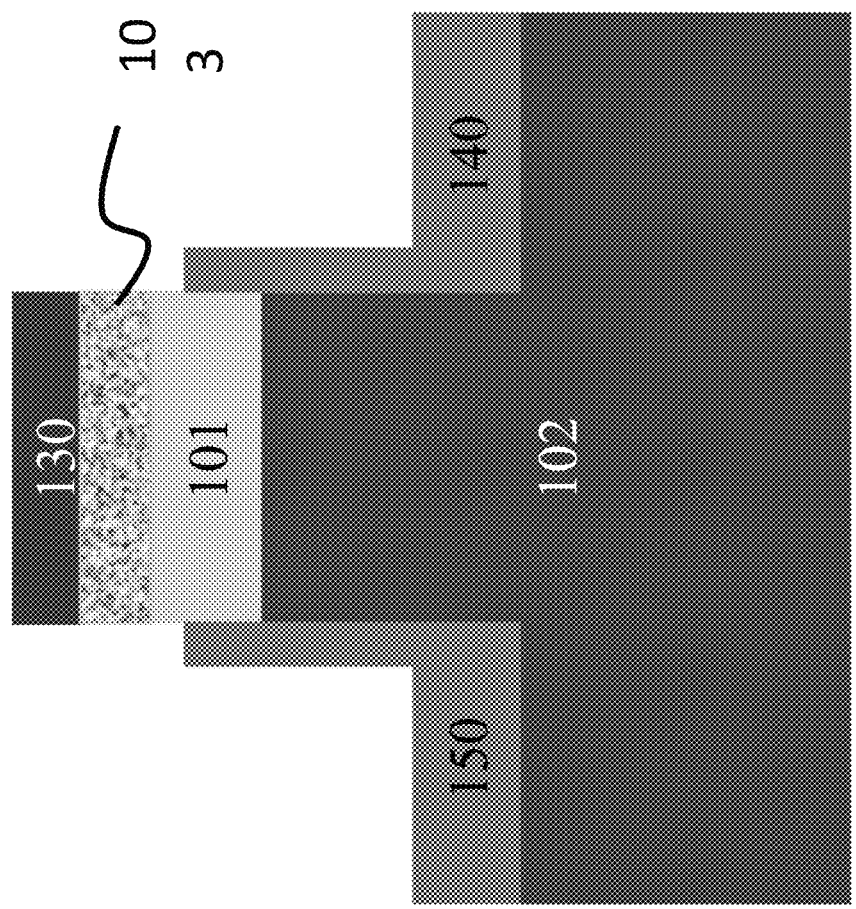
FIG. 8 shows a 2-D cross section is the middle of the channel of the transistor according to one embodiment.

FIG. 8 shows a 2-D cross section is the middle of the channel of the transistor according to one embodiment. In this embodiment, the transistor includes a dielectric layer 103 sandwiched between the top gate electrode and the cap layer. This structure allows to decrease the gate leakage current and improves the efficiency by reducing the power loss.

Figure 9:
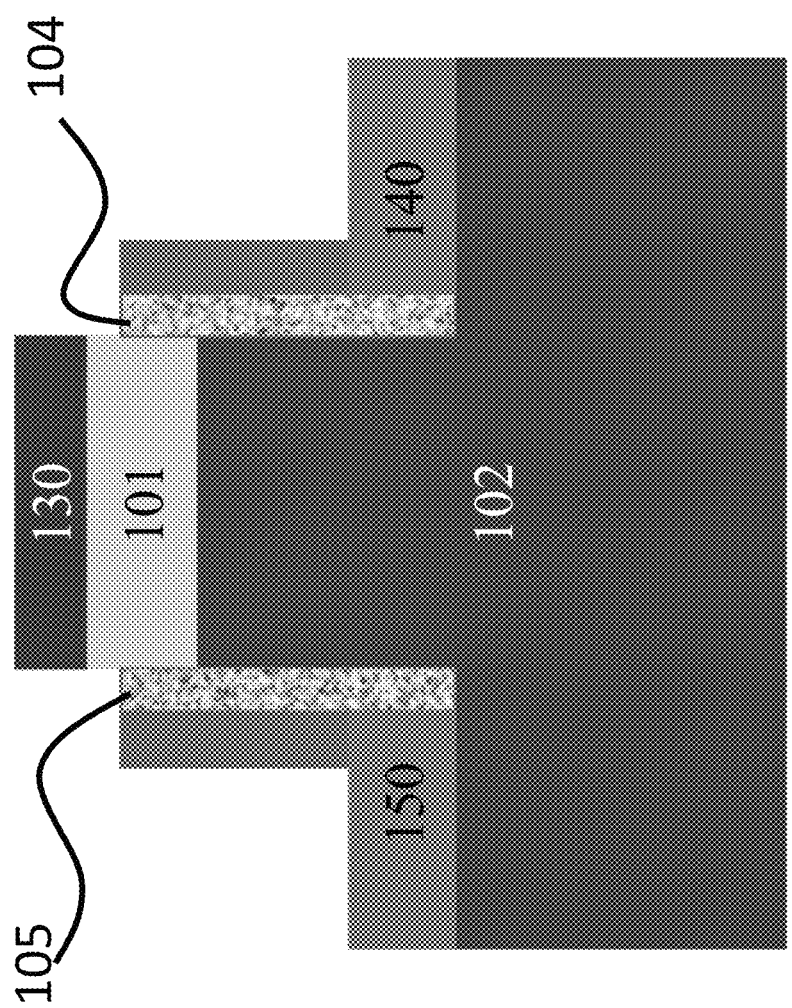
FIG. 9 shows a 2-D cross section in the middle of the channel of the transistor according to one embodiment.

FIG. 9 shows a 2-D cross section in the middle of the channel of the transistor according to one embodiment. In this embodiment, the transistor includes a dielectric layer 104 and 105 sandwiched between the side gate electrode and the fin side wall. This dielectric layer helps to reduce the gate leakage from the side wall.

Figure 10:
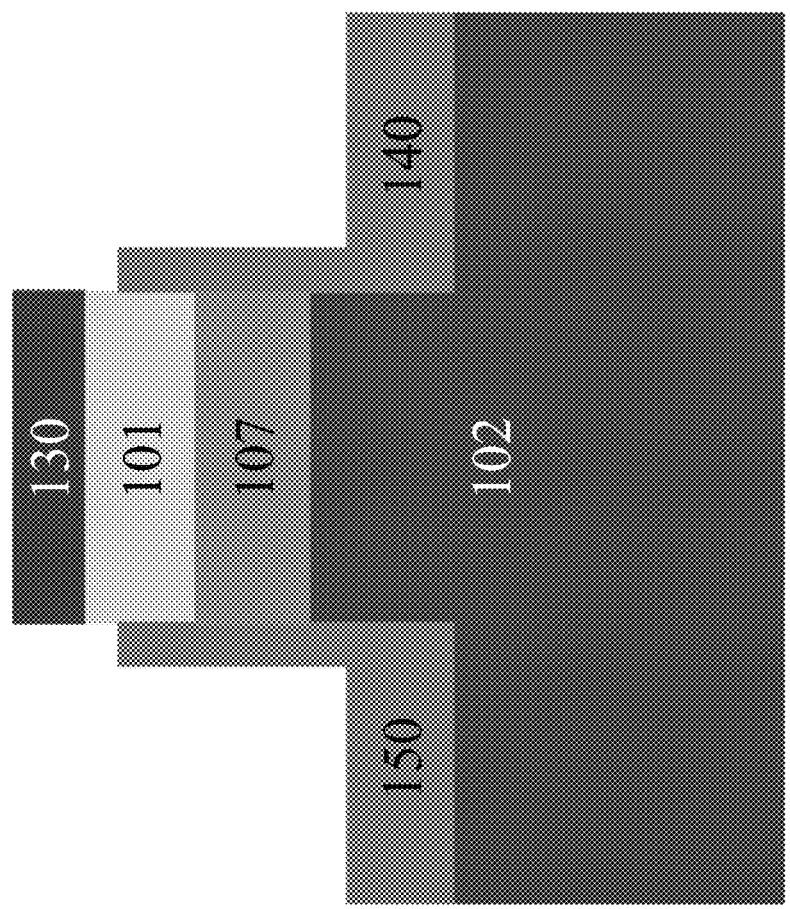
FIG. 10 shows a 2-D cross section in the middle of the channel of the transistor according to one embodiment.

FIG. 10 shows a 2-D cross section in the middle of the channel of the transistor according to one embodiment. In this embodiment, the semiconductor structure includes a back barrier layer 107. The purpose of a back barrier layer is to provide quantum confinement to the 2-DEG formed at the interface of channel and cap layer. According to one embodiment the back barrier is doped with p-type dopants.

Figure 11:
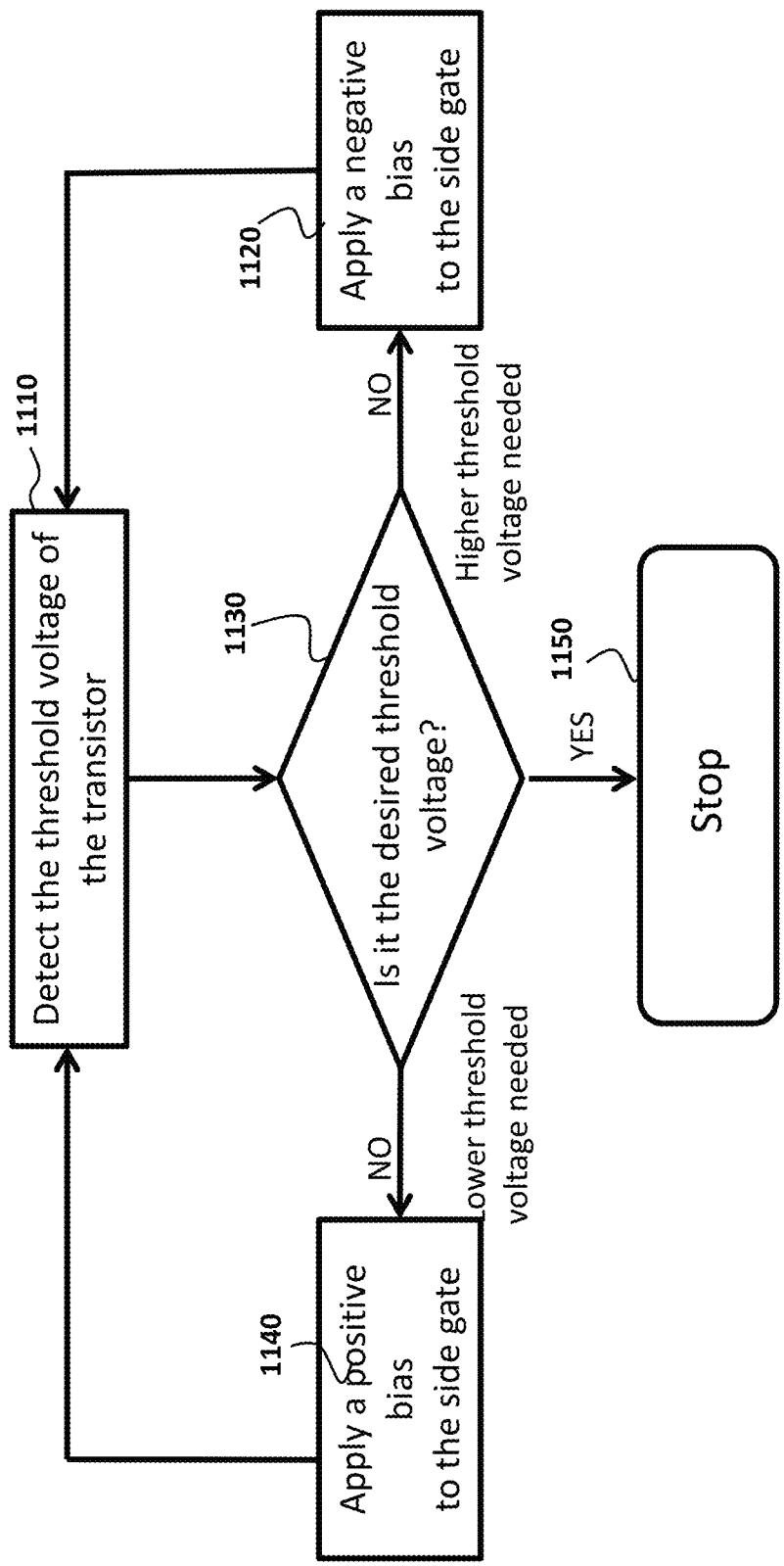
FIG. 11 shows a flow chart of a method for controlling the threshold voltage of the transistor according to various embodiments.

FIG. 11 shows a flow chart of a method for controlling the threshold voltage of the transistor according to various embodiments. The method measures 1110 the threshold voltage without applying any side gate voltage. The method checks 1130 the desired threshold voltage to detect a request to change a sign of the threshold voltage with respect to the source. For example, if a higher threshold voltage is needed, the method applies 1120 negative bias to the side gate. For example, the method applies a negative voltage to the side gate when the threshold voltage is negative and the positive threshold voltage is required. On the other hand, if a lower threshold voltage is needed, then the method applies 1140 positive bias to the side gate. For example, the method applies a positive voltage to the side gate when the threshold voltage is positive and the negative threshold voltage is required.

Additionally, or alternatively, if enhancement mode operation is required then the method keeps increasing the negative bias at the side gate until the threshold voltage becomes greater than zero. Generally, for driver circuits and most power electronic applications enhancement mode operation is preferred.

Figure 12:
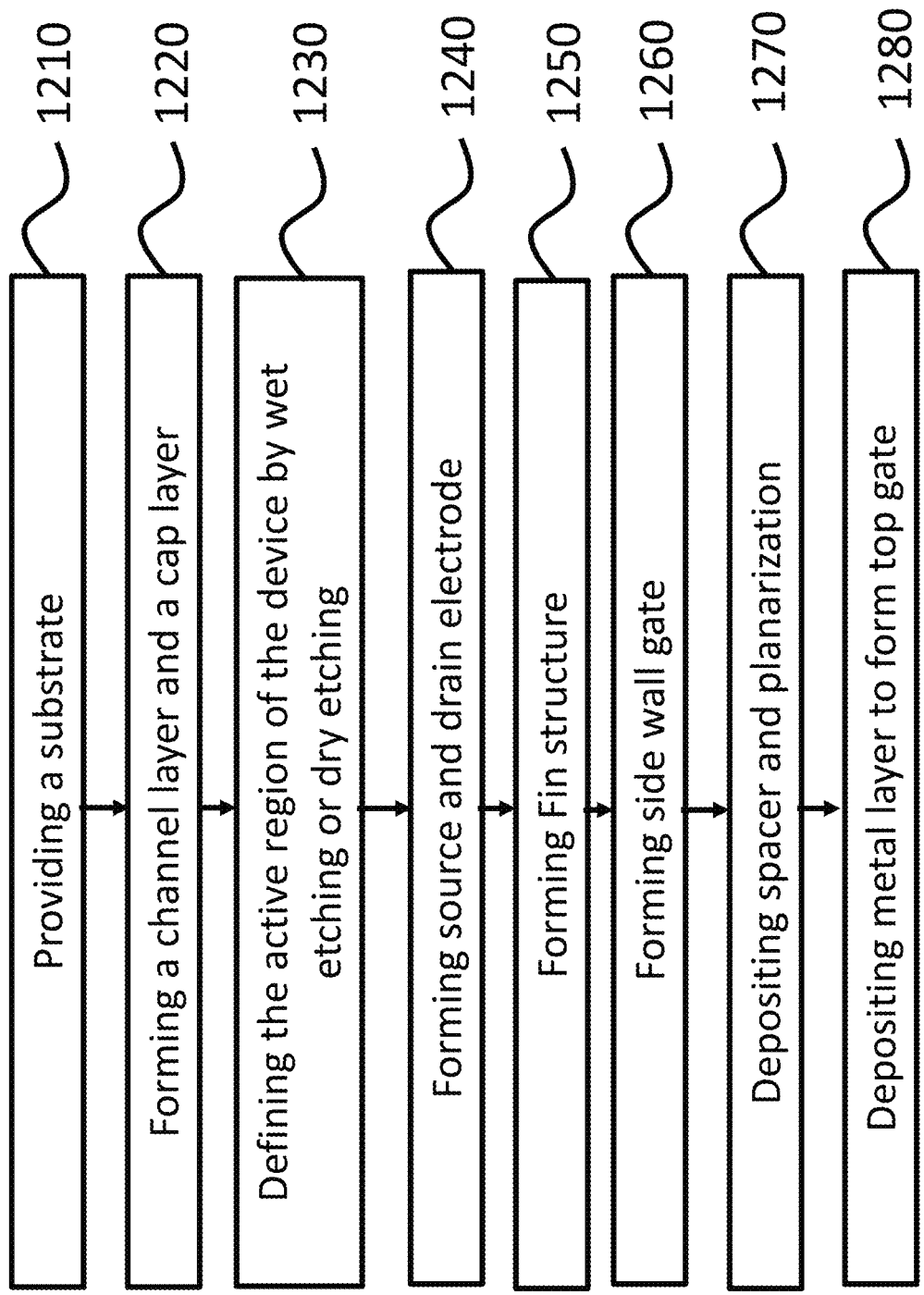
FIG. 12 shows a block diagram of a method for fabricating a semiconductor device according to some embodiments.

FIG. 12 shows a block diagram of a method for fabricating a semiconductor device according to some embodiments. The method includes providing a substrate 1210, making 1220 a semiconductor structure comprising at least a III-N channel layer forming a carrier channel in the semiconductor structure. The material of cap-layer has a higher bandgap than the bandgap of material in the III-N channel layer. According to some embodiments, various methods can be adopted for the growth and formation of the cap-layer or channel layer, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system.

The method defines 1230 the active region of the transistor by wet etching or dry etching and forms 1240 the source and the drain electrode to electrically connect to the carrier channel using one or combination of an ebeam deposition, a joule evaporation, a chemical vapor deposition and a sputtering process. Then the sample is annealed >800° C. in vacuum or N2 environment to form the ohmic contact. The method forms 1250 the fin structure, e.g., by depositing hard mask and dry etching, and forming 1260 the side wall gate, e.g., by depositing metal and then blank etching.

The method also includes deposition 1270 of a spacer dielectric layer, e.g., using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition. Then the method planarizes the spacer layer by blank etching.

Further method also includes the formation 1280 of the metal layer for the gate electrode. The formation of this metal layer can be done using one or combination of Lithography→Metal Deposition→Lift-off, and Metal deposition→Lithography→Etching. Here the lithography could be performed using, including but not limited to photolithography, electron-beam lithography. Metal deposition can be done using one or combination of an ebeam deposition, a joule evaporation, a chemical vapor deposition and a sputtering process.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

The invention claimed is:

1. A high electron mobility transistor, comprising:
    a set of electrodes including a source, a drain, a top gate, and a side gate; and
    a semiconductor structure having a fin extending between the source and the drain, wherein the top gate is arranged on top of the fin, wherein the side gate is arranged on a sidewall of the fin at a distance from the top gate making the top gate nonintegral with the side gate to prevent physical and electrical contacts between the side gate and the top gate, such that the top gate is configured to accept a first voltage independently from a second voltage applied to the side gate, and the side gate is configured to accept the second voltage independently from the first voltage applied to the side gate, wherein the semiconductor structure includes a cap layer positioned beneath the top gate and a channel layer arranged beneath the cap layer for providing electrical conduction, wherein the cap layer includes nitride-based semiconductor material configured to enable a heterostructure forming a carrier channel between the source and the drain, wherein the side gate has an L-shape, wherein a first leg of the L-shape is arranged on the sidewall of the fin, and wherein a second leg of the L-shape is substantially perpendicular to the first leg.

2. The transistor of claim 1, wherein the transistor includes two gates arranged on the opposite sidewalls of the fin.

3. The transistor of claim 2, wherein the side gate is made of semiconductor material.

4. The transistor of claim 3, wherein the semiconductor material of the side gate is p-doped semiconductor.

5. The transistor of claim 1, further comprising:
    a dielectric layer arranged between the top gate and the top surface of the fin, or between the side gate and the sidewall of the fin, or combination thereof.

6. The transistor of claim 1, wherein the semiconductor structure includes AlInGaN.

7. The transistor of claim 1, wherein a voltage applied to the top gate with respect to the source modulates the conductivity of a carrier channel between the source and the drain, and wherein a voltage applied to the side gate with respect to the source modulates a threshold voltage of the transistor.

8. The transistor of claim 7, wherein the voltage applied to the side gate is negative to move the threshold voltage towards a positive domain with respect to the source.

9. The transistor of claim 8, wherein an absolute value of the negative voltage applied to the side gate is proportional to a linearity of the transistor.

10. The transistor of claim 7, wherein the voltage applied to the side gate is positive to move the threshold voltage towards a negative domain with respect to the source.

11. The transistor of claim 1, wherein the width of the fin is less than 400 nm.

12. The transistor of claim 1, further comprising a ferroelectric oxide (FE) layer arranged between the side gate and the sidewall of the fin.

13. The transistor of claim 12, wherein the width of the fin is greater than 400 nm.

14. A method for controlling the transistor of claim 1, the method comprising:
- applying a voltage to the top gate with respect to the source to modulate the conductivity of a carrier channel between the source and the drain; and
- applying a voltage to the side gate with respect to the source to modulate a threshold voltage of the transistor.

* * * * *